Sept. 2, 1958 L. D. ARMSTRONG ET AL 2,850,444

PULSE METHOD OF ETCHING SEMICONDUCTOR JUNCTION DEVICES

Filed Nov. 1, 1954

INVENTORS
LORNE D. ARMSTRONG &
PHILIP KUZNETZOFF

BY J. C. Whittaker
ATTORNEY

United States Patent Office 2,850,444
Patented Sept. 2, 1958

2,850,444

PULSE METHOD OF ETCHING SEMICONDUCTOR JUNCTION DEVICES

Lorne D. Armstrong, Princeton, and Philip Kuznetzoff, East Orange, N. J., assignors to Radio Corporation of America, a corporation of Delaware Application November 1, 1954, Serial No. 465,772

8 Claims. (Cl. 204—143)

This invention relates to improved methods of etching germanium semiconductor devices and more particularly to improved methods of etching such devices as junction transistors and diodes which have rectifying junctions exposed upon their surfaces.

It is known to etch germanium semiconductor devices of the junction type after the junctions are formed in order to remove contaminating surface material and also remove disturbed surface layers of the crystalline germanium. Etching is particularly desirable in devices having relatively large area p–n rectifying junctions, the peripheries of which are exposed at the surface of the devices. Such junctions are especially sensitive to contamination and to little understood effects produced by exposure of the surfaces to the atmosphere or to other substances. Etching the devices after the junctions are formed has been found to improve the electrical characteristics of the junctions and especially to increase their back-direction resistances and their breakdown voltages.

Accordingly, one object of the instant invention is to provide improved methods of etching germanium semiconductor devices.

Another object is to provide improved methods of etching large area junction type semiconductor devices to improve the electrical characteristics of the junctions.

A further object is to provide improved germanium junction type semiconductor devices characterized by reduced back-direction current, increased dynamic resistance and improved stability.

Previously known methods of etching germanium semiconductor devices comprise simple chemical etching or electrolytic etching at relatively low rates of electrolysis. It has now been discovered that surprisingly improved results may be obtained by electrolytically etching junction type semiconductor devices at relatively high rates of electrolysis. In particular, according to the instant invention the devices are subjected to a series of relatively short duration high current pulses in an electrolytic bath and preferably simultaneously etched with a constant, small electrolyzing current.

The invention will be explained in greater detail in connection with the accompanying drawing of which:

Similar reference characters are applied to similar elements throughout the drawing.

Figure 1:
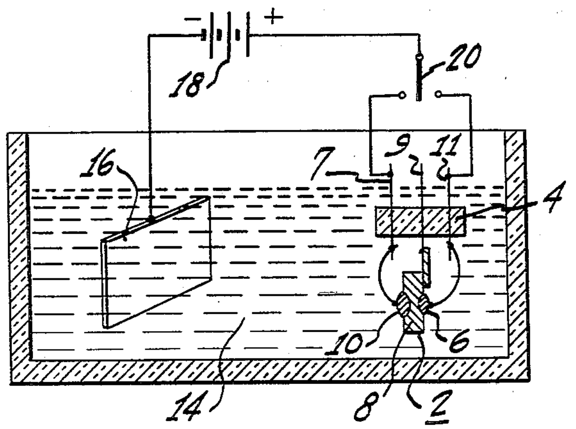
Figure 1 is a schematic, cross-sectional, elevational view of apparatus for etching a transistor device according to one embodiment of the invention.

The practice of the invention will be described herein with particular reference to a typical alloy junction type triode transistor 2 such as shown in Figure 1. This transistor comprises a base wafer 8 of essentially single crystal n-type semiconductive germanium having a resistivity of about 2 ohm-cm. An emitter electrode 6 and a collector electrode 10 which may be of indium are fused upon opposite surfaces of the wafer to form p–n rectifying junctions in the wafer. The electrodes and the base are connected by lead wires to respective lead pins 7, 9 and 11 which are sealed through a glass or ceramic mounting base 4. The germanium wafer may be about .085" x 0.12" x .005" thick. The electrodes are roughly circular in shape, the emitter electrode being about .015" and the collector electrode being about .045" in diameter at their respective surfaces of contact with the wafer.

According to the invention the device is electrolytically etched in a concentrated alkaline electrolyte 14 which may be, for example, a saturated aqueous solution of potassium hydroxide. The device is immersed in the electrolyte and the collector electrode 10 is anodically connected through its lead wire, lead pin 7, a switch 20, and a direct current source 18 to an insoluble electrode 16 which is also immersed in the electrolyte. The etching is accomplished by a series of relatively short duration, high current pulses which may be controlled by alternately closing and opening the switch. For the collector electrode a series of 5 pulses of about one second duration each, spaced about two seconds apart appears to provide optimum results in the particular transistor described herein.

The emitter electrode 6 is then etched with a series of 2 one second pulses spaced about two seconds apart. The device is then immediately removed from the electrolyte, rinsed in distilled water and dried. It may then be conventionally potted by any known technique such as by sealing it within an evacuated container or by casting it in a thermosetting resin.

In the practice of the invention as described herein with respect to a typical alloy junction triode transistor, satisfactorily high current densities are accomplished by utilizing a low impedance direct current source of about 8 volts potential. The insoluble electrode 16 should, of course, have a relatively large area compared to the total surface area of the transistor device being etched. An area ratio of at least about 100:1 is desirable in order to insure adequate current flow. Under these conditions the current during a pulse on the .045" diameter collector electrode normally comprises about 0.8 to 1.0 ampere, the current during a pulse on the emitter being slightly less than this value.

In etching according to the heretofore described embodiment of the invention the rest time between current pulses appears to be critical. For reasons that are presently not entirely clear, adverse effects result if the rest periods substantially exceed about three pulse lengths in duration. It is believed that these effects may be caused by diffusion of cations in the electrolyte toward the device surface and adsorption of the cations by the surface. Accordingly, a second and preferred embodiment of the invention provides a constant, uninterrupted etching current of relatively small magnitude in addition to the high current pulses.

Figure 2:
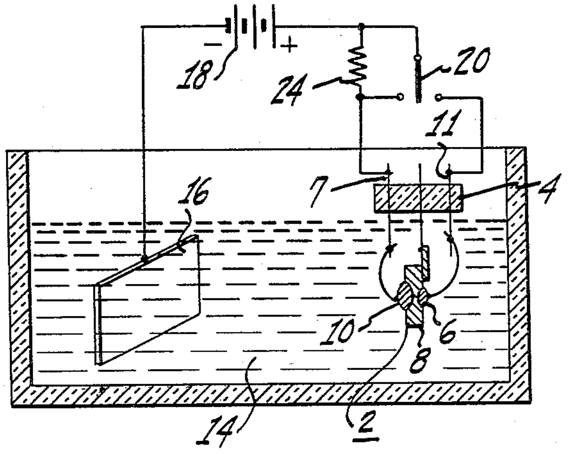
Figure 2 is a schematic, cross-sectional, elevational view of apparatus for etching a transistor device according to a preferred embodiment of the invention.

Referring now to Figure 2, a transistor 2 similar to the transistor heretofore described in connection with the embodiment of Figure 1 is pulse etched according to the same program as heretofore described. In addition, the collector electrode 10 of the transistor is connected to the electric current source 18 through a current limiting resistor 24 of about 275 ohms to provide a constant etching current of about 30 milliamperes upon which the high current pulses are superimposed. The constant current serves to stabilize the electrolyte and to minimize diffusion of cations toward the transistor during the rest periods between the pulses. With the addition of the constant current, or bias to the process the rest periods may be considerably extended. Further, it is no longer necessary to remove the transistor from the electrolyte immediately after completion of the pulse program. Uniformity of results is improved and the critical timing of the rest periods is obviated.

The value of the current limiting resistor is, of course, not critical. It will depend upon the potential of the current source as well as upon the other resistive parameters of the circuit. In general, any known means may be provided to induce a constant electrolyzing current equal in magnitude to about 2% to 5% of the peak pulse etching current. In the case of the particular transistor described herein a constant current of about 25 to 30 ma. gives optimum results, although satisfactory results are also achieved through the use of any current in the range of about 20 to 50 ma.

It is not definitely known why etching according to the invention provides improved results in the fabrication of junction type devices. It is presently believed, however, that at least in the case of p–n–p transistors the electric field distribution around the etched transistor tends to concentrate the etching upon the most critical surface portions of the device. This distribution results from the provision of a relatively high conductivity electrolyte in combination with a relatively high electrolyzing potential and a reverse bias applied across a rectifying barrier. An etching potential applied to the collector electrode, for example, acts effectively to bias the emitter barrier in the reverse direction and to create a relatively intense electric field across the emitter barrier. This intense field induces a relatively large electrolyzing current through the critical surface area immediately surrounding the emitter electrode, i. e., the area bearing the exposed portion of the emitter barrier. In a similar manner an etching potential applied to the emitter electrode tends to electrolyze the collector barrier surface areas.

The intermittent nature of the etching is essential in the practice of the invention apparently because it serves to minimize local ion depletion effects in the electrolyte. Such ion depletion occurring at or near the etched surface appears to disturb the desired electric field and to decrease the current through the critical surface areas.

The practice of the invention is applicable not only to the particular transistor device heretofore described but also to all other large area junction type semiconductor devices utilizing germanium bases. For example, grown junction devices may be similarly etched and also devices such as junction diodes and hook transistors. The invention is applicable regardless of the polarity of the devices, i. e., it is equally effective with n–p–n and p–n–p devices and with devices having n-type electrodes as well as devices having p-type bases and n-type electrodes.

Preferred electrolytes according to the invention include lithium, sodium and potassium hydroxides of at least 25% by weight concentration. These electrolytes are highly conductive and maintain germanium etch products in solution through the formation of a complex ion. The formation of solid etch products which may contaminate the devices is thus avoided.

The use of concentrated strong acid electrolytes is not desirable because they may chemically attack the devices being treated and because generally, they do not dissolve the etch products. Satisfactory results may be achieved, however, with dilute sulfuric acid electrolytes such as 1% concentration if care is taken to avoid the deposition of precipitated etch products upon the device surfaces.

It will, of course, be realized that no generalized statement can be made with respect to the absolute value of the pulse etching current most advantageous for etching all different germanium devices. The devices are of many different shapes and sizes and a certain amount of trial may be necessary to determine the precise pulse amplitude that gives opimum results with any given device. However, the potential between the device and the electrolyte immediately adjacent to it should be about 4 to 5 volts during a pulse. When using a concentrated, high-conductivity electrolyte such as a saturated alkali solution a relatively high proportion of the electrolyzing potential appears at the device surface. When other solutions are utilized the applied potential should be correspondingly increased to compensate for any reduction in solution conductivity so that the potential gradient at the etched surface is brought up to the desired value.

The duration of the current pulses is important only as to its upper limit. The pulses preferably should be limited to about one second in length in order to avoid the adverse effects of localized ion depletion in the electrolyte. They may be made as short as convenient, however, the only limitation being one of expense in providing extremely short pulses. When etching without a biasing current the time between pulses appears to be significant and, for optimum results is preferably limited to not more than twice the duration of the individual pulses.

Alloy junction transistors treated according to the instant invention exhibit surprisingly improved properties as compared to similar devices treated according to previous practice. For example, the reverse currents ($I_{co}$) across the collector barriers of typical devices such as those heretofore described with the emitter open circuited is in most instances reduced to less than one microampere at 2 volts, and the dynamic impedance of the collector barrier is increased to a value of 10 to 200 megohms. Further, the stability of the units with respect to time is improved so that when they are properly encapsulated by known techniques they have improved service lives and exhibit less deterioration upon standing in storage.

What is claimed is:

1. Method of etching a semiconductor device including a body of semiconductive germanium having a rectifying barrier disposed therein, said method comprising contacting an electrolyte to said device and applying high current density unidirectional pulses through said device into said electrolyte, each of the intervals between said pulses not substantially exceeding about three pulse lengths in duration, said device being anodic with respect to said electrolyte.

2. Method of etching a semiconductor device including a body of semiconductive germanium having a rectifying barrier disposed therein, peripheral portions of said barrier being exposed upon the surface of said body, said method comprising contacting an electrolyte to said surface and passing a series of high current density unidirectional electric pulses through said device into said electrolyte, each of the intervals between said pulses not substantially exceeding about three pulse lengths in duration, said device being anodic with respect to said electrolyte.

3. Method of etching a semiconductor device including a body of semiconductive germanium having a rectifying barrier disposed therein, said method comprising contacting an electrolyte to said device and passing a series of high current density electric pulses through said device into said electrolyte, said device being anodic with respect to said electrolyte, said pulses having a duration of not more than about one second each and being spaced apart a time equal to less than twice the duration of the individual pulses.

4. Method of etching a semiconductor device including a body of n-type semiconductive germanium having a pair of indium electrodes fused to opposite surfaces thereof and a pair of p-n rectifying junctions within said body, each of said junctions being associated with one of said electrodes, said method comprising contacting an electrolyte to said device, said electrolyte being an aqueous solution of a compound selected from the group consisting of LiOH, NaOH and KOH and having a concentration of at least 25 wgt. percent, intermittently applying a unidirectional potential of about 4 to 5 volts between one of said electrodes and said electrolyte in a direction to make said electrode anodic with respect to said electrolyte, thereby to induce a series of high current density electric pulses through said device and said electrolyte to etch said device, each of the intervals between said pulses not substantially exceeding about three pulse lengths in duration.

5. Method of etching a semiconductor device including a body of n-type semiconductive germanium having a pair of metallic electrodes fused to opposite surfaces thereof and a pair of rectifying barriers within said body, each of said barriers being associated with and adjacent to one of said electrodes, said method comprising the steps of contacting an electrolyte to said device, said electrolyte being an aqueous solution of a compound selected from the group consisting of LiOH, NaOH and KOH and having a concentration of at least 25 wgt. percent, intermittently applying a unidirectional potential of about 4 to 5 volts between a first one of said electrodes and said electrolyte in a direction to make said electrode anodic with respect to said electrolyte, thereby to induce a first series of high current density electric pulses through said device and said electrolyte to etch said device, and subsequently intermittently applying a potential of about 4 to 5 volts between the second one of said electrodes and said electrolyte in a direction to make said second electrode anodic with respect to said electrolyte, thereby to induce a second series of high current density electric pulses to etch said device, each of the intervals between said pulses not substantially exceeding about three pulse lengths in duration.

6. Method of etching a semiconductor device including a body of semiconductive germanium having a rectifying barrier disposed therein, said method comprising contacting an electrolyte to said device, causing a unidirectional electric current to flow from said device into said electrolyte and simultaneously applying high current density unidirectional pulses through said device into said electrolyte, said device being anodic with respect to said electrolyte, each of the intervals between said pulses not substantially exceeding about three pulse lengths in duration, said pulses having a current value at least 20 times greater than said unidirectional current.

7. The method of claim 6 wherein peripheral portions of said barrier are exposed on the surface of said body and wherein said electric current is maintained at a minimum value while said electrolyte contacts said surface.

8. Method of etching a semiconductor device including a body of n-type semiconductive germanium having a pair of metallic electrodes fused to opposite surfaces thereof and a pair of rectifying barriers within said body, each of said barriers being associated with and adjacent to one of said electrodes, said method comprising the steps of contacting an electrolyte to said device, said electrolyte being an aqueous solution of a compound selected from the group consisting of LiOH, NaOH and KOH and having a concentration of at least 25 wgt. percent, applying a potential between one of said electrodes and said electrolyte to induce an etching electric current through said device and said electrolyte, maintaining said etching current at a minimum value while said electrolyte contacts said device, intermittently applying a unidirectional potential of about 4 to 5 volts between a first one of said electrodes and said electrolyte in a direction to make said electrode anodic with respect to said electrolyte, thereby to induce a first series of high current density electric pulses through said device and said electrolyte to etch said device, and subsequently intermittently applying a potential of about 4 to 5 volts between the second one of said electrodes and said electrolyte in a direction to make said second electrode anodic with respect to said electrolyte, thereby to induce a second series of high current density electric pulses to etch said device, each of the intervals between said pulses not substantially exceeding about three pulse lengths in duration and each of said pulses having a current value at least 20 times greater than said minimum value.

References Cited in the file of this patent

UNITED STATES PATENTS

| | | |
|---|---|---|
| 2,421,863 | Beck | June 10, 1947 |
| 2,582,020 | Emery | Jan. 8, 1952 |
| 2,631,356 | Sparks et al. | Mar. 17, 1953 |
| 2,656,496 | Sparks | Oct. 20, 1953 |
| 2,783,197 | Herbert | Feb. 26, 1957 |